United States Patent
Lv et al.

(10) Patent No.: US 10,784,450 B2
(45) Date of Patent: Sep. 22, 2020

(54) DISPLAY PANEL AND DISPLAY DEVICE

(71) Applicant: Wuhan China Star Optoelectronics Semiconductor Display Technology Co., Ltd., Wuhan, Hubei (CN)

(72) Inventors: Linhong Lv, Guangdong (CN); Liang Sun, Guangdong (CN); Peng Li, Guangdong (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 345 days.

(21) Appl. No.: 15/748,713

(22) PCT Filed: Jan. 10, 2018

(86) PCT No.: PCT/CN2018/072073
§ 371 (c)(1),
(2) Date: Jan. 30, 2018

(87) PCT Pub. No.: WO2019/119560
PCT Pub. Date: Jun. 27, 2019

(65) Prior Publication Data
US 2020/0091444 A1    Mar. 19, 2020

(30) Foreign Application Priority Data
Dec. 18, 2017 (CN) ............... 2017 1 1366975

(51) Int. Cl.
*H01L 51/00* (2006.01)
*H01L 27/32* (2006.01)
(Continued)

(52) U.S. Cl.
CPC ...... *H01L 51/0097* (2013.01); *H01L 27/3244* (2013.01); *H01L 51/5008* (2013.01);
(Continued)

(58) Field of Classification Search
None
See application file for complete search history.

(56) References Cited

U.S. PATENT DOCUMENTS

| | | | |
|---|---|---|---|
| 2014/0097408 A1* | 4/2014 | Kim | H01L 27/3237 257/40 |
| 2018/0104915 A1 | 4/2018 | Liu | |
| 2018/0226617 A1* | 8/2018 | Nakagawa | H01L 51/56 |

FOREIGN PATENT DOCUMENTS

| | | |
|---|---|---|
| CN | 104538425 A | 4/2015 |
| CN | 106848108 A | 6/2017 |

(Continued)

*Primary Examiner* — Steven B Gauthier
(74) *Attorney, Agent, or Firm* — Hemisphere Law, PLLC; Zhigang Ma

(57) ABSTRACT

The present disclosure discloses a display panel including a flat layer, a mixed layer and a base film layer sequentially disposed; wherein the mixed layer includes an organic film layer and a multi-film structure, the organic film layer and the multi-film structure are alternately distributed on the base film layer in a direction parallel to the base film layer. In the present disclosure, the ability to omni-directionally bend a display panel is improved by replacing the inorganic film layer in a specific area below the flat layer of the display panel with an organic film layer to improve the omnibearing bending ability of the display panel and enhance the user experience.

19 Claims, 4 Drawing Sheets

(51) Int. Cl.
*H01L 51/50* (2006.01)
*H01L 51/52* (2006.01)

(52) U.S. Cl.
CPC .......... *H01L 51/52* (2013.01); *H01L 2251/30* (2013.01); *H01L 2251/50* (2013.01); *H01L 2251/5338* (2013.01)

(56) References Cited

FOREIGN PATENT DOCUMENTS

| | | |
|---|---|---|
| CN | 106920800 A | 7/2017 |
| CN | 107425044 A | 12/2017 |

\* cited by examiner

US 10,784,450 B2

DISPLAY PANEL AND DISPLAY DEVICE

RELATED APPLICATIONS

The present application is a National Phase of International Application Number PCT/CN2018/072073, filed Jan. 10, 2018, and claims the priority of China Application 201711366975.6, filed Dec. 18, 2017.

FIELD OF THE DISCLOSURE

The present disclosure relates to a display technology field, and more particularly to a display panel and a display device.

BACKGROUND OF THE DISCLOSURE

AMOLED is an OLEO classified according to driving a way, AMOLED has advantages in energy consumption, display quality and life cycle. After years of application, AMOLED technology is more and more mature, the market demand is also increasing. AMOLED has a wide color gamut, high contrast, energy saving and folding, etc., one of the most competitive technologies in the new generation of displays, especially the foldable flexible display technology has drawn more and more attention and popularity. An omnidirectional flexible display concept that can be bent in any direction will receive widespread attention. It will have a wide range of applications in the future, such as smart wearable devices, automotive equipment, home appliances and other fields. Can bend in any direction into different shapes of the display screen can greatly improve people's visual range and visual effects, while saving space.

However, one of the difficulties of the all-round flexible display technology is in the bendability of the film layer. In the prior art, the display panel includes a flat layer, a second metal layer, an inorganic layer, a first metal layer, a Poly layer and a PI layer which are sequentially arranged. The flat layer is used for isolating the second metal layer and the TFT layer from each other to prevent the electric field from interfering with each other and at the same time to make the planarization effect; the inorganic layer is used to isolate the first metal layer from the second metal layer to prevent the electric fields from interfering with each other; Poly layer, that is, low temperature polysilicon (LTPS); PI layer is the base film layer. In the prior art, the flexible display panel of OLED has the omnibearing bending performance, which cannot meet the needs of users and affect the user experience.

Therefore, it is necessary to provide an improved display panel and display device.

SUMMARY OF THE DISCLOSURE

The technical problem to be solved by the present disclosure is to provide a display panel and a display device. By replacing a specific area of the inorganic film layer under the flat layer of the display panel with an organic film layer, the ability of the display panel to be bent in all directions can be improved and the user experience can be improved.

In order to solve the above technical problem, the first technical solution adopted by the present disclosure is to provide a display panel including a flat layer, a mixed layer and a base film layer sequentially disposed; wherein the mixed layer includes an organic film layer and a multi-film structure, the organic film layer and the multi-film structure are alternately distributed on the base film layer in a direction parallel to the base film layer; the multi-film structure includes a first metal layer, a projection area of the first metal layer is adjacent to or interval to a projection area of the organic film layer; the projection areas of the first metal layer and the organic film layer are alternately arranged in a direction parallel to the base film layer; the display panel includes a display area, a second metal layer is disposed between the flat layer and the multi-film structure in a first area of the display area, the multi-film structure includes an inorganic layer, and the inorganic layer is located between the first metal layer and the second metal layer.

In order to solve the above technical problem, the second technical solution adopted by the present disclosure is to provide a display panel including a flat layer, a mixed layer and a base film layer sequentially disposed; wherein the mixed layer includes an organic film layer and a multi-film structure, the organic film layer and the multi-film structure are alternately distributed on the base film layer in a direction parallel to the base film layer.

In order to solve the above technical problem, the third technical solution adopted by the present disclosure is to provide a display device including a display panel including a flat layer, a mixed layer and a base film layer sequentially disposed; wherein the mixed layer includes an organic film layer and a multi-film structure, the organic film layer and the multi-film structure are alternately distributed on the base film layer in a direction parallel to the base film layer.

The beneficial effects of the present disclosure are: different from the prior art, in the present disclosure, the ability to omni-directionally bend a display panel is improved by replacing the inorganic film layer in a specific area below the flat layer of the display panel with an organic film layer to improve the omnibearing bending ability of the display panel and enhance the user experience.

DETAILED DESCRIPTION OF PREFERRED EMBODIMENTS

The technical solutions in the embodiments of the present disclosure are clearly and completely described below with reference to the accompanying drawings in the embodiments of the present disclosure. Obviously, the described embodiments are only a part but not all of the embodiments of the present disclosure. All other embodiments obtained by a person of ordinary skill in the art based on the embodiments of the present disclosure without creative efforts shall fall within the protection scope of the present disclosure.

The present disclosure provides a display panel including a flat layer, a mixed layer and a base film layer sequentially disposed; wherein the mixed layer includes an organic film layer and a multi-film structure, the organic film layer and the multi-film structure are alternately distributed on the base film layer in a direction parallel to the base film layer.

Figure 1:
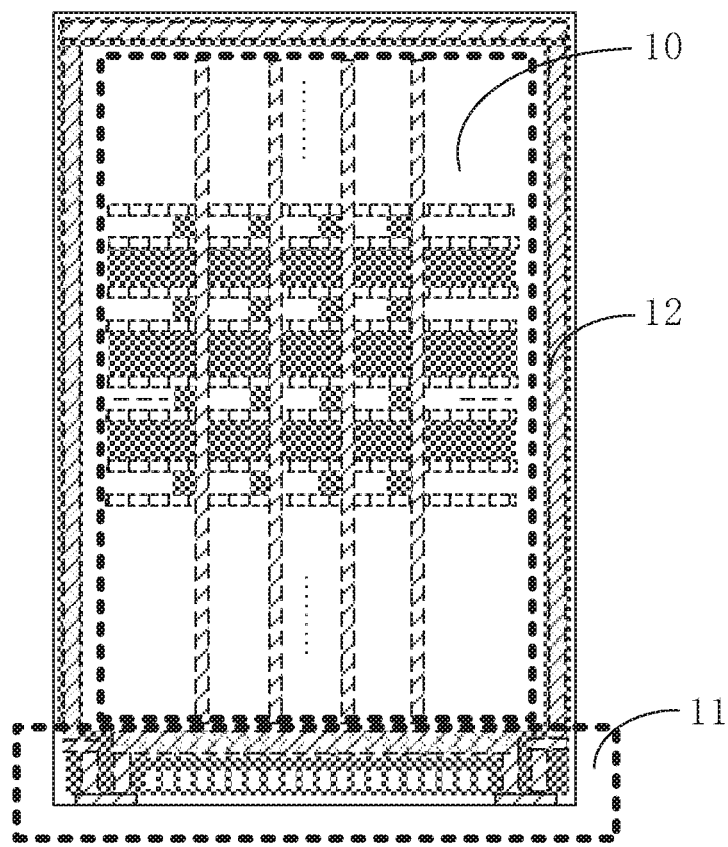
FIG. 1 is a schematic plan view of an embodiment of the display panel of the present disclosure.

To clearly illustrate the specific structure of the display panel, referring to FIG. 1, FIG. 1 is a schematic plan view of an embodiment of the display panel of the present disclosure.

As shown in FIG. 1, the display panel includes a display area 10 and a non-display area. The non-display area includes a first area of the non-display area 11 and a second area of the non-display area 12. In the present embodiment, the shape of the display panel is rectangular, the display area 10 is located at the middle of the display panel, the non-display area and the periphery of the display panel include an upper edge region, a lower edge region, a left edge region and a right edge region. The second area of the non-display area 12 includes the upper edge region, the left edge region and the right edge region and the first area of the non-display area 11 includes the lower edge region of the display panel. In other embodiments, the shape of the display panel may also be hexagonal, circular or the like. The first area of the non-display area 11 may also be located in other edge regions, which is not limited in the present disclosure.

Figure 2:
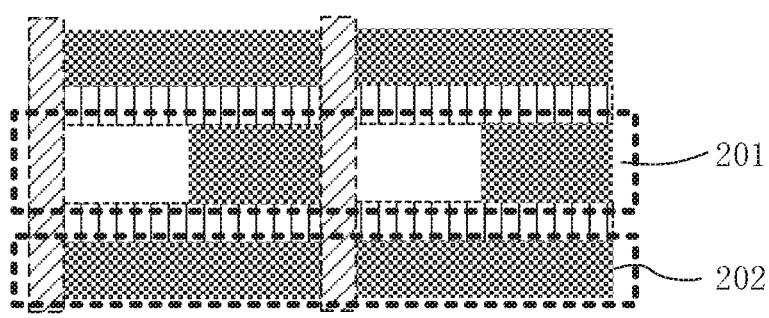
FIG. 2 is a schematic plan view of an embodiment of the display area of the display panel of FIG. 1.

For a detailed description of the specific structure of the display area 10, please refer to FIG. 2. FIG. 2 is a schematic plan view of an embodiment of the display area of the display panel of FIG. 1. With reference to FIG. 1 and FIG. 2, the display area 10 includes a first area of the display area 201 and a second area of the display area 202. The first area of the display area 201 and the second area of the display area 202 are alternately distributed. It should be noted that FIG. 2 is only a partial plan structural view of the display area, only one first area of the display area 201 and two second areas of the display area 202 are shown in the figure. The display area 10 may include a plurality of first areas of the display area 201 and a second area of the display area 202.

Figure 3:
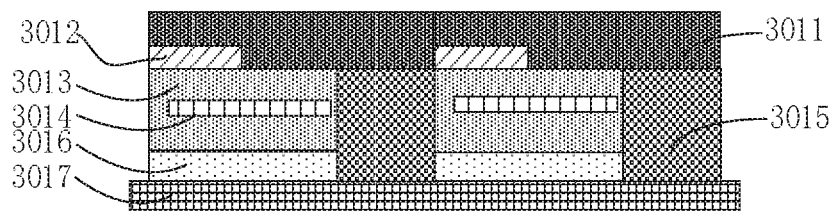
FIG. 3 is a cross-sectional structural diagram of an embodiment of the first area of the display area of the display panel of FIG. 2.

Referring to FIG. 3, FIG. 3 is a cross-sectional structural diagram of an embodiment of the first area of the display area of the display panel of FIG. 2. In conjunction with FIG. 2 and FIG. 3, the first area of the display area 201 includes a flat layer 3011, a mixed layer and a base film layer 3017 disposed in sequence. The mixed layer includes an organic film layer 3015 and a multi-layer structure. The multi-layer structure includes an inorganic layer 3013, a first metal layer 3014, and a Poly layer 3016. The organic film layer 3015 and the multi-layer structure are alternately distributed on the base film layer 3017 in a direction parallel to the base film layer 3017. Both the flat layer 3011 and the base film layer 3017 are made of a flexible material, such as PI (polyimide), which can increase the bending performance of the display panel. The organic film layer 3015 is spaced from the projection area of the first metal layer 3014. It should be noted that the projection area of the organic film layer 3015 is the projection area of the organic film layer 3015 on the plane of the display panel and the projection area of the first metal layer 3014 is the projection area of the first metal layer 3014 on the plane of the display panel. The projection areas of the first metal layer 3014 and the organic film layer 3015 are alternately arranged in a direction parallel to the base film layer 3017. Further, a second metal layer 3012 is disposed between the flat layer 3011 and the mixed layer, and the inorganic layer 3013 is located between the first metal layer 3014 and the second metal layer 3012. The inorganic layer 3013 can insulate the first metal layer 3014 and the second metal layer 3012, effectively improving the safety of the display panel, at the same time, the organic film layer 3015 has better bending ability and improves the ability of the display panel to bend in all directions.

Figure 4:
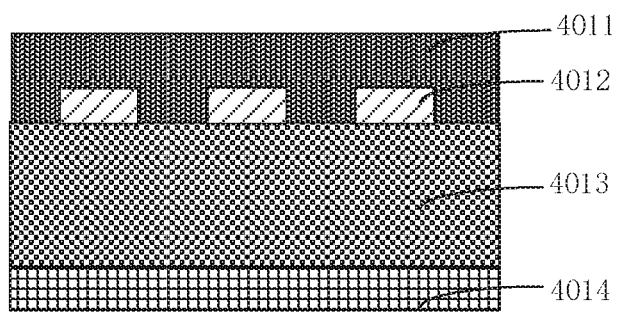
FIG. 4 is a cross-sectional structural diagram of an embodiment of the second area of the display area of the display panel of FIG. 2.

Referring to FIG. 4, FIG. 4 is a cross-sectional structural diagram of an embodiment of the second area of the display area of the display panel of FIG. 2. In conjunction with FIG. 2 and FIG. 4, the second area of the display area 202 includes a flat layer 4011, a second metal layer 4012, a mixed layer and a base film layer 4014 disposed in sequence. Here, the organic layer 4013 is contained in the mixed layer. The second metal layer 4012 is disposed between the flat layer 4011 and the organic film layer 4013. The flat layer 4011 and the base film layer 4014 are made of a flexible material, such as PI (polyimide), which can increase the bending performance of the display panel. The organic film layer 4013 has better bending ability and improves the ability of the display panel to bend in all directions.

Figure 5:
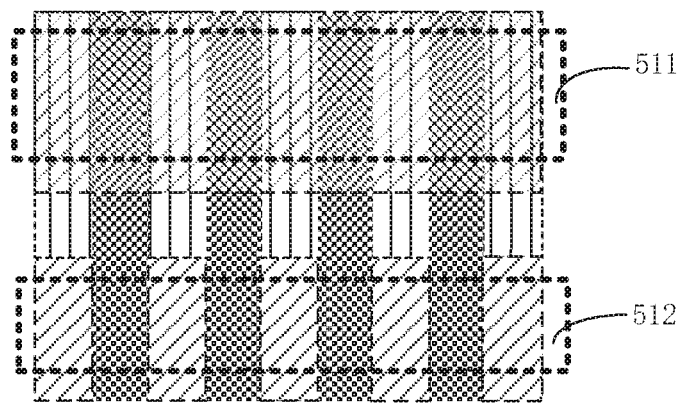
FIG. 5 is a schematic plan view of an embodiment of the first area of the non-display area of the display panel of FIG. 1.

In order to clearly illustrate the specific structure of the first area of the non-display area 11, referring to FIG. 5, FIG. 5 is a schematic plan view of an embodiment of the first area of the non-display area of the display panel of FIG. 1. In conjunction with FIG. 1 and FIG. 5, the first area of the non-display area 11 includes a upper edge region of the first area of the non-display area 511 and a lower edge region of the first area of the non-display area 512. In the present embodiment, the upper edge region of the first area of the non-display area 511 is a fan-out area (input end) of the display panel.

Figure 6:
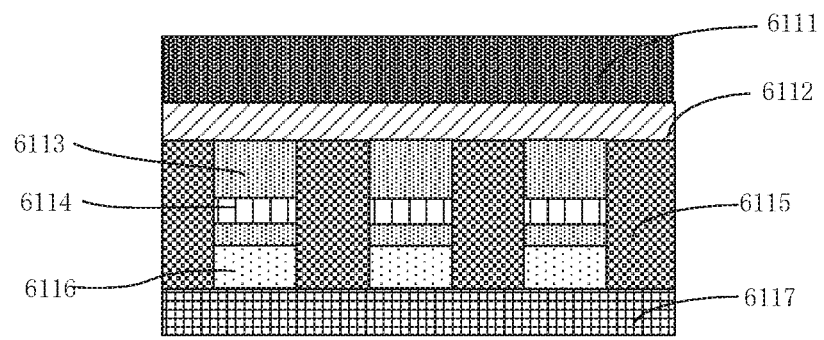
FIG. 6 is a cross-sectional structural diagram of an embodiment of the upper edge region of the first area of the non-display area of the display panel of FIG. 5.

Referring to FIG. 6, FIG. 6 is a cross-sectional structural diagram of an embodiment of the upper edge region of the first area of the non-display area of the display panel of FIG. 5. In conjunction with FIG. 5 and FIG. 6, the upper edge region of the first area 511 includes a flat layer 6111, a mixed layer and a base film layer 6117, the mixed layer includes an organic film layer 6115 and a multi-layer structure. The multi-layer structure includes an inorganic layer 6113, a first metal layer 6114, and a Poly layer 6116. The organic film layer 3015 and the multi-film structure are distributed on the base film layer 6117 in a direction parallel to the base film layer 6117. Both the flat layer 6111 and the base film 6117 are made of a flexible material, such as PI (polyimide), which can increase the bending performance of the display panel. The projection area of the organic film layer 6115 and the first metal layer 6114 is adjacent to the projection area of the organic film layer 6115. It should be noted that the projection area of the organic film layer 6115 is the projection area of the organic film layer 6115 on the plane of the display panel and the projection area of the first metal layer 6114 is the projection area of the first metal layer 6114 on the plane of the display panel. The projection areas of the first metal layer 6114 and the organic film layer 6115 are alternately distributed in a direction parallel to the base film layer 6117. Further, a third metal layer 6112 is disposed between the flat layer 6111 and the mixed layer, and the third metal layer 6112 includes a metal line of a power line in the periphery of the display panel. The inorganic layer 6113 is located between the first metal layer 6114 and the third metal layer 6112. The inorganic layer 6113 can insulate the first metal layer 6114 and the third metal layer 6112, effectively improving the safety of the display panel, at the same time, the organic film layer 6115 has better bending ability and improves the ability of the display panel to bend in all directions.

The structure of the lower edge region of the first area of the non-display area 512 and the second area of the display area 202 is similar, and the details are not described herein again. In the lower region of the first area of the non-display area 514, the mixed layer includes an organic film layer, which has better bending ability and improves the ability of the display panel to be bent in all directions.

Figure 7:
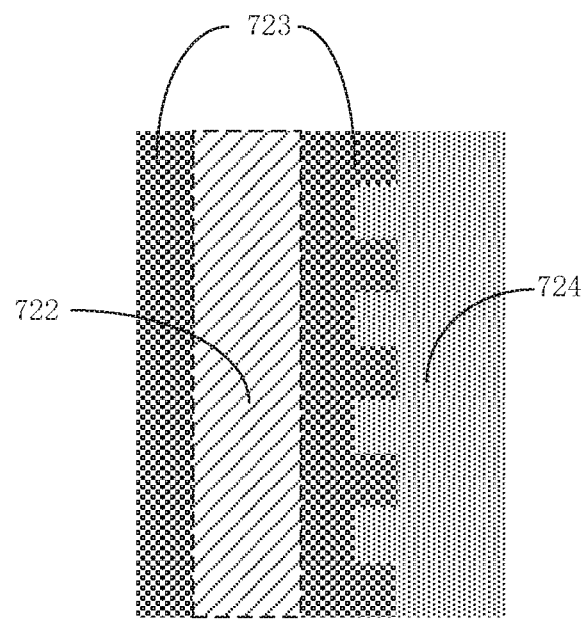
FIG. 7 is a schematic plan view of an embodiment of the second area of the non-display area of the display panel of FIG. 1.

Referring to FIG. 7, FIG. 7 is a schematic plan view of an embodiment of the second area of the non-display area of the display panel of FIG. 1. In conjunction with FIG. 1 and FIG. 7, the second area of the non-display area 12 of the display panel includes a third metal layer 722, a mixed layer and an inorganic layer 724. Wherein the mixed layer includes an organic film layer 723. The inorganic layer 724 is located at the edge of the display panel for protecting the organic film layer 723 and the metal layer. The organic film layer 723 and the inorganic layer 724 are in a dentate occlusal contact. It should be noted that, the organic film layer 723 and the inorganic layer 724 are not limited to the linear dentate occlusal contact in FIG. 7. In other embodiments, the organic film layer 723 and the inorganic layer 724 may also be in the form of a snap-in occlusal contact or a curvilinear occlusal contact, which is not limited in the present disclosure. Since the organic film layer 723 is in occlusal contact with the inorganic layer 724, the folding effect can be improved, and no damage occurs when a large bending of the display panel occurs.

Figure 8:
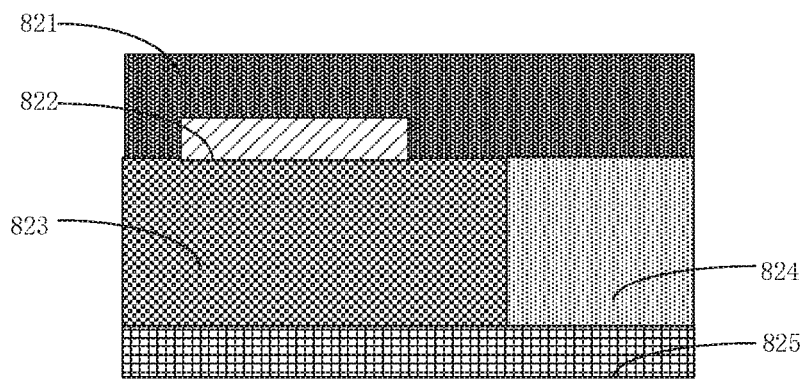
FIG. 8 is a cross-sectional structural diagram of an embodiment of the second area of the non-display area of the display panel of FIG. 1.

Referring to FIG. 8, FIG. 8 is a cross-sectional structural diagram of an embodiment of the second area of the non-display area of the display panel of FIG. 1. In conjunction with FIG. 1, FIG. 7 and FIG. 8, the second area of the non-display area 12 of the display panel includes a flat layer 821, a third metal layer 822, a mixed layer, and a base film layer 825. The mixed layer includes an organic film layer 823 and an inorganic layer 824, and the third metal layer 822 is disposed between the flat layer 821 and the organic film layer 823. Both the flat layer 821 and the base film layer 825 are made of flexible materials, such as PI (polyimide), which can increase the bending performance of the display panel. The mixed layer in this region includes an organic film layer 823 and an inorganic layer 824. The organic film layer 823 has good bending ability and improves the ability of the display panel to be bent in all directions. The inorganic layer 824 is located at the edge of the display panel for protecting the organic film layer 823 and the metal layer. The occlusal contact between the organic film 823 and the inorganic layer 824 can improve the folding effect and ensure that no damage occurs when a large bending of the display panel occurs.

Figure 9:
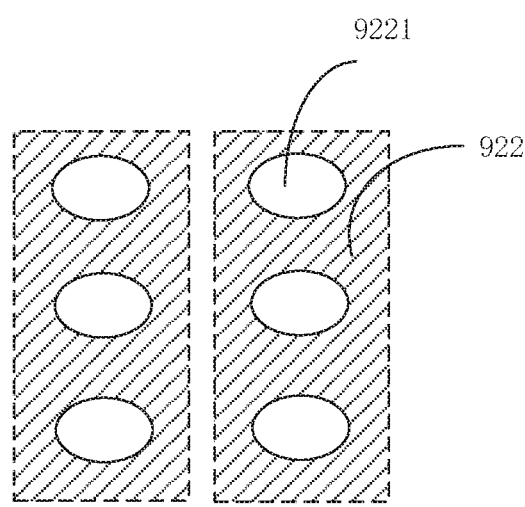
FIG. 9 is a schematic structural diagram of an embodiment of the metal wire in the third metal layer of the display panel of FIG. 8.

Referring to FIG. 9, FIG. 9 is a schematic structural diagram of an embodiment of the metal wire in the third metal layer of the display panel of FIG. 8. As shown in FIG. 9, the third metal layer 922 is located between the flat layer and the mixed layer and is located in the non-display area of the display panel. The metal wire 922 in the third metal layer is provided with a through hole 9221. In the present embodiment, the shape of the through hole 9221 is elliptical. In other embodiments, the shape of the through hole 9221 may be circular, square or the like. Through holes in the metal line increase the ability to bend metal lines.

The display panel in the above embodiments can be applied to various display devices, such as a display, a television and the like.

Different from the prior art, the ability to omni-directionally bend a display panel is improved by replacing the inorganic film layer in a specific area below the flat layer of the display panel with an organic film layer to improve the omnibearing bending ability of the display panel and enhance the user experience.

The foregoing descriptions are merely embodiments of the present disclosure, and do not limit the scope of the present disclosure. Any equivalent structures or equivalent changes made using the contents of the specification and the drawings of the present disclosure or directly or indirectly applied to other related technical fields are also included in the scope of the patent protection of the present disclosure.

What is claimed is:

1. A display panel, comprising a flat layer, a mixed layer and a base film layer sequentially disposed;
   wherein the display panel comprises a display area in a middle of the display panel, and a non-display area at a periphery of the display panel;
   wherein the display area comprises first areas of the display area and second areas of the display area different from the first areas of the display area, the first areas of the display area and the second areas of the display area are alternately distributed;
   wherein the non-display area comprises a first area of the non-display area and a second area of the non-display area, the first area of the non-display area is located at a side of the display area and comprises a fan-out area of the display panel, and the second area of the non-display area is located at another side of the display area;
   wherein in any one of the first areas of the display area and the fan-out area, the mixed layer comprises an organic film layer and a multi-film structure, the organic film layer and the multi-film structure are alternately distributed on the base film layer in a direction parallel to the base film layer, the multi-film structure comprises a first metal layer, a projection area of the first metal layer is adjacent to or interval to a projection area of the organic film layer, and the projection areas of the first metal layer and the organic film layer are alternately arranged in a direction parallel to the base film layer;
   wherein in any one of the first areas of the display area, a second metal layer is disposed between the flat layer and the multi-film structure, the multi-film structure comprises an inorganic layer, and the inorganic layer is located between the first metal layer and the second metal layer;
   wherein in the second area of the non-display area, the flat layer, a third metal layer, the mixed layer and the base film layer are sequentially disposed, the mixed layer comprises the organic film layer and further comprises the inorganic layer being at an edge of the display panel and for protecting the organic film layer and the third metal layer, the third metal layer is located between the flat layer and the organic film layer, and the organic film layer and the inorganic layer at the edge of the display panel are in occlusal contact with each other.

2. The display panel according to claim 1, wherein the second metal layer is disposed between the flat layer and the organic film layer in the second area of the display area.

3. The display panel according to claim 2, wherein a through hole is disposed on the second metal layer.

4. The display panel according to claim 1, wherein a through hole is disposed on the third metal layer.

5. A display panel, comprising a flat layer, a mixed layer and a base film layer sequentially disposed;
wherein the display panel comprises a display area in a middle of the display panel, and a non-display area at a periphery of the display panel;
wherein the display area comprises first areas of the display area and second areas of the display area different from the first areas of the display area;
wherein the non-display area comprises a first area of the non-display area and a second area of the non-display area, the first area of the non-display area is located at a side of the display area and comprises a fan-out area of the display panel, and the second area of the non-display area is located at another side of the display area;
wherein in any one of the first areas of the display area and the fan-out area, the mixed layer comprises an organic film layer and a multi-film structure, the organic film layer and the multi-film structure are alternately distributed on the base film layer in a direction parallel to the base film layer;
wherein in the second area of the non-display area, the flat layer, a third metal layer, the mixed layer and the base film layer are sequentially disposed, the mixed layer comprises the organic film layer and further comprises an inorganic layer being at an edge of the display panel and for protecting the organic film layer and the third metal layer, the third metal layer is located between the flat layer and the organic film layer, and the organic film layer and the inorganic layer at the edge of the display panel are in occlusal contact with each other.

6. The display panel according to claim 5, wherein in any one of the first areas of the display area and the fan-out area, the multi-film structure comprises a first metal layer, a projection area of the first metal layer is adjacent to or interval to a projection area of the organic film layer.

7. The display panel according to claim 6, wherein in any one of the first areas of the display area and the fan-out area, the projection areas of the first metal layer and the organic film layer are alternately arranged in a direction parallel to the base film layer.

8. The display panel according to claim 6, wherein in any one of the first areas of the display area, a second metal layer is disposed between the flat layer and the multi-film structure, and the multi-film structure comprises the inorganic layer located between the first metal layer and the second metal layer.

9. The display panel according to claim 8, wherein the second metal layer is disposed between the flat layer and the organic film layer in the second area of the display area.

10. The display panel according to claim 8, wherein a through hole is disposed on the second metal layer.

11. The display panel according to claim 6, wherein in the first area of the non-display area, the third metal layer is disposed between the flat layer and the mixed layer, and the mixed layer comprises the inorganic layer located between the first metal layer and the third metal layer.

12. The display panel according to claim 11, wherein a through hole is disposed on the third metal layer.

13. A display device, comprising a display panel comprising a flat layer, a mixed layer and a base film layer sequentially disposed;
wherein the display panel comprises a display area in a middle of the display panel, and a non-display area at a periphery of the display panel;
wherein the display area comprises first areas of the display area and second areas of the display area different from the first areas of the display area;
wherein the non-display area comprises a first area of the non-display area and a second area of the non-display area, the first area of the non-display area is located at a side of the display area and comprises a fan-out area of the display panel, and the second area of the non-display area is located at another side of the display area;
wherein in any one of the first areas of the display area and the fan-out area, the mixed layer comprises an organic film layer and a multi-film structure, the organic film layer and the multi-film structure are alternately distributed on the base film layer in a direction parallel to the base film layer;
wherein in the second area of the non-display area, the flat layer, a third metal layer, the mixed layer and the base film layer are sequentially disposed, the mixed layer comprises the organic film layer and further comprises an inorganic layer being at an edge of the display panel and for protecting the organic film layer and the third metal layer, the third metal layer is located between the flat layer and the organic film layer, and the organic film layer and the inorganic layer at the edge of the display panel are in occlusal contact with each other.

14. The display device according to claim 13, wherein in any one of the first areas of the display area and the fan-out area, the multi-film structure comprises a first metal layer, a projection area of the first metal layer is adjacent to or interval to a projection area of the organic film layer.

15. The display device according to claim 14, wherein in any one of the first areas of the display area and the fan-out area, the projection areas of the first metal layer and the organic film layer are alternately arranged in a direction parallel to the base film layer.

16. The display device according to claim 14, wherein in any one of the first areas of the display area, a second metal layer is disposed between the flat layer and the multi-film structure, and the multi-film structure comprises the inorganic layer located between the first metal layer and the second metal layer.

17. The display device according to claim 16, wherein the second metal layer is disposed between the flat layer and the organic film layer in the second area of the display area.

18. The display device according to claim 16, wherein a through hole is disposed on the second metal layer.

19. The display device according to claim 14, wherein in the first area of the non-display area, the third metal layer is disposed between the flat layer and the mixed layer, and the mixed layer comprises the inorganic layer located between the first metal layer and the third metal layer.

\* \* \* \* \*